United States Patent
Thakar et al.

(10) Patent No.: US 12,158,616 B2
(45) Date of Patent: Dec. 3, 2024

(54) COMPOSITE CONNECTOR CARRYING POWER, ELECTRO-OPTICAL DATA, AND FLUID INPUT/OUTPUT

(71) Applicant: Cisco Technology, Inc., San Jose, CA (US)

(72) Inventors: Anant Thakar, Los Altos, CA (US); Bidyut Kanti Sen, Milpitas, CA (US); Jayaprakash Balachandran, Fremont, CA (US); D. Brice Achkir, Livermore, CA (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 420 days.

(21) Appl. No.: 17/547,789

(22) Filed: Dec. 10, 2021

(65) Prior Publication Data
US 2023/0185029 A1      Jun. 15, 2023

(51) Int. Cl.
*H01R 12/59* (2011.01)
*G02B 6/38* (2006.01)
*G02B 6/42* (2006.01)
*H05K 5/02* (2006.01)

(52) U.S. Cl.
CPC ......... *G02B 6/3817* (2013.01); *G02B 6/4292* (2013.01); *H01R 12/598* (2013.01); *H05K 5/0286* (2013.01)

(58) Field of Classification Search
None
See application file for complete search history.

(56) References Cited

U.S. PATENT DOCUMENTS

| | | | |
|---|---|---|---|
| 6,430,052 B1 * | 8/2002 | Kordes | H05K 7/20545 165/185 |
| 6,821,146 B2 | 11/2004 | Tolmie | |
| 8,632,354 B2 * | 1/2014 | George | H01R 24/62 439/375 |

(Continued)

FOREIGN PATENT DOCUMENTS

CN      109413940 A      3/2019

OTHER PUBLICATIONS

"FiberOptic Cable and Connector Solutions," Fischer Connectors, https://www.fischerconnectors.com/us/en/products/fiberoptic, retrieved Dec. 10, 2021, 13 pages.

(Continued)

*Primary Examiner* — Tho D Ta
(74) *Attorney, Agent, or Firm* — Edell, Shapiro & Finnan, LLC

(57) ABSTRACT

A composite connector includes modular data connectors, electrical power connectors, a fluid exchange connector, an alignment feature, and a housing. The modular data connectors include electrical data connectors and optical data connectors and are configured to carry data. The electrical power connectors are configured to carry electrical power, and the fluid exchange connector is configured to carry cooling fluid. The composite connector includes an alignment feature to align the composite connector with a complementary connector. The housing of the composite connector is configured to contain the modular data connectors, the electrical power connectors, the fluid exchange connector, and the alignment feature in a confined physical space.

20 Claims, 14 Drawing Sheets

(56) References Cited

U.S. PATENT DOCUMENTS

| | | | |
|---|---|---|---|
| 9,007,221 B2 * | 4/2015 | Zeighami | H05K 7/20836 |
| | | | 165/80.4 |
| 10,130,241 B2 * | 11/2018 | Amling | H01R 13/005 |
| 10,288,816 B2 * | 5/2019 | Smith | G02B 6/3885 |
| 10,746,934 B2 * | 8/2020 | Patel | G02B 6/13 |
| 10,763,606 B1 * | 9/2020 | Esmaily | H01R 13/5219 |
| 10,795,096 B1 | 10/2020 | Leigh et al. | |
| 11,051,425 B2 * | 6/2021 | Sharf | H05K 7/20218 |
| 2009/0324176 A1 | 12/2009 | Cheng et al. | |
| 2013/0322830 A1 | 12/2013 | Tan et al. | |
| 2014/0328562 A1 | 11/2014 | Pitwon | |
| 2015/0289405 A1 | 10/2015 | Stewart et al. | |
| 2016/0128239 A1 | 5/2016 | Mulcahy et al. | |
| 2018/0267265 A1 | 9/2018 | Zhang et al. | |
| 2019/0341661 A1 * | 11/2019 | Guerra | B60L 53/16 |
| 2020/0073061 A1 | 3/2020 | Leigh et al. | |
| 2020/0163251 A1 * | 5/2020 | Chopra | H05K 7/20636 |
| 2021/0019069 A1 | 1/2021 | Sen et al. | |

OTHER PUBLICATIONS

Jeff Dobbelaere, "HPE Synergy Gen 10—Composable Infrastructure," Mainline Information Systems, https://mainline.com/hpe-synergy-gen-10-composable-infrastructure/, retrieved Mar. 8, 2021, 6 pages.

Jim Fields, "5 Reasons to Consider HPE Synergy," Connected IT Blog, https://community.connection.com/5-reasons-to-consider-hpe-synergy/, Sep. 3, 2019, 5 pages.

Timothy Prickett Morgan, "Dell Moves One Step Closer to Composable With Poweredge MX," The Net Platform, https://www.nextplatform.com/2018/08/21/dell-moves-one-step-closer-to-composable-with-poweredge-mx/, Aug. 21, 2018, 12 pages.

* cited by examiner

COMPOSITE CONNECTOR CARRYING POWER, ELECTRO-OPTICAL DATA, AND FLUID INPUT/OUTPUT

TECHNICAL FIELD

The present disclosure relates to Input/Output (I/O) connectors, particularly in confined deployments with limited physical space.

BACKGROUND

Disaggregated computing systems partition system resources from the processing subsections. For instance, Central Processing Unit (CPU) nodes may be separate from fabric cards, Graphics Processing Unit (GPU) subsections, memory pools, accelerators, and/or Non-Uniform Memory Access (NUMA) compute blades with composable options. Input/Output (I/O) access between the processing subsections and the system resources present a possible bottleneck in system speed with disaggregated computing, especially as the amount of data handled by the computing system increases.

DESCRIPTION OF EXAMPLE EMBODIMENTS

Overview

An apparatus comprising modular data connectors, electrical power connectors, a fluid exchange connector, an alignment feature, and a housing is provided. The plurality of modular data connectors are configured to carry data and include electrical data connectors and optical data connectors. The apparatus includes at least one pair of electrical power connectors configured to carry electrical power, and a fluid exchange connector configured to carry cooling fluid. The apparatus also includes an alignment feature to align the apparatus with a complementary connector. The housing of the apparatus is configured to contain the plurality of modular data connectors, the electrical power connectors, the fluid exchange connector, and the alignment feature in a confined physical space.

Example Embodiments

Heterogeneous compute and composable architectures require I/O to scale as compute cores, accelerators, memory units, and other system resources are distributed to different Printed Circuit Boards (PCBs) and/or different enclosure and connected via an I/O fabric. Typically, a CPU handles most of the I/O traffic through electrical signals, such as Compute Express Link (CXL) or Peripheral Component Interconnect Express (PCIe). Removing these electrical I/O signals from the CPU enclosure for heterogeneous computing and composable infrastructure presents technical challenges in the electrical domain from a bandwidth and distance perspective.

Optical I/O may resolve some of these challenges and is typically used in data centers in the network domain, but not in the compute I/O interconnect fabric domain. The requirements in power, distance, cost, and bandwidth may vary significantly between the network domain and the I/O interconnect fabric domain. For instance, the bandwidth requirements for an I/O interconnect fabric is typically an order of magnitude higher than the bandwidth requirements for network traffic.

Additionally, as the volume of I/O is scaling for compute nodes of increasing power, thermal management may be switched from air cooling to liquid cooling to handle the increased heat generated by the compute nodes. Liquid cooling circulates cold and hot fluid in and out of the system, which requires an additional plumbing interconnect.

The composite connector described herein modularizes the data connectors such that existing electrical I/O data connectors may be replaced with optical data connectors as the amount of I/O data increases. Additionally, the composite connector includes a fluid interconnect to allow liquid cooling of higher power nodes.

Figure 1A:
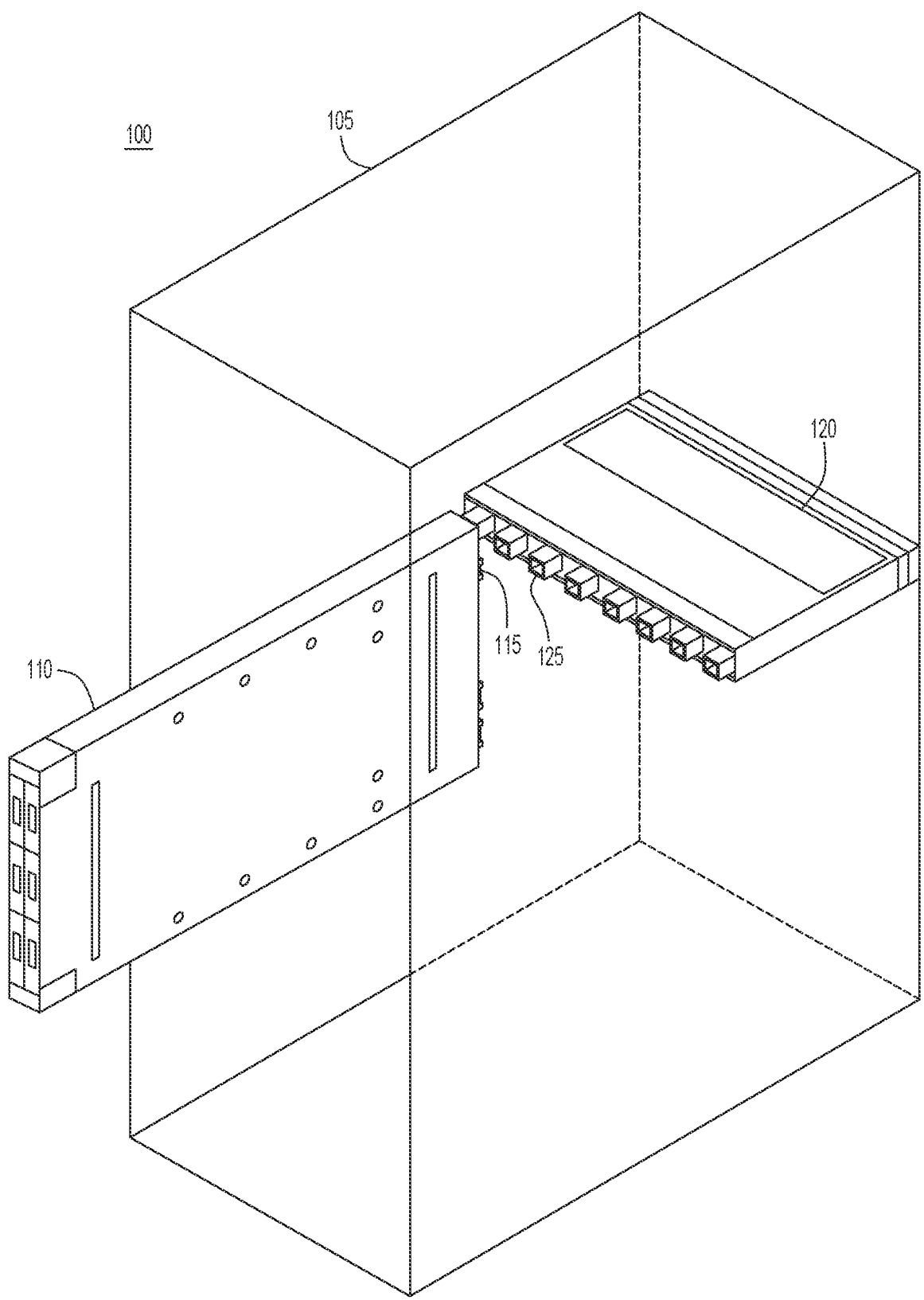
FIG. 1A illustrates a disaggregated computing system connecting a processing node with a fabric card through a composite connector, according to an example embodiment.

Referring now to FIG. 1A, an example of a disaggregated computing system 100 is shown. The disaggregated computing system 100 is mounted in a rack 105 and includes a computing node 110 and a fabric node 120. The computing node 110 includes a composite connector 115 that conforms to a complementary composite connector 125 on the fabric node 120. As shown in FIG. 1A, the computing node 110 is orthogonally connected to the fabric node 120. Typical Ortho-Direct (OD) connectors are used in this configuration to enable multiple computing nodes to be connected to multiple fabric nodes within the same rack 105. In one example, the computing node 110 may be a blade with two or more CPU units within the enclosure of the computing node 110. In another example, the fabric node 120 may be an I/O fabric card, such as a Fabric Extender Module (FEM) configured to route I/O data to other computing nodes or other system resources (e.g., memory pools, hardware accelerators, etc.) not shown in FIG. 1A.

In a further example, the computing node 110 may include multiple composite connectors similar to the composite connector 115. Similarly, the fabric node 120 may include multiple complementary connectors similar to the complementary composite connector 125. As used herein, a complementary composite connector is any type of connector that can mate with a composite connector as described herein. The composite connectors and the complementary composite connectors may be configured as the same type of connector, such that any connector is capable of mating with any other connector. Alternatively, the composite connector 115 and the complementary composite connector 125 may include combinations of asymmetrical connectors (e.g., male/female connectors) that are configured to mate when properly aligned.

Figure 1B:
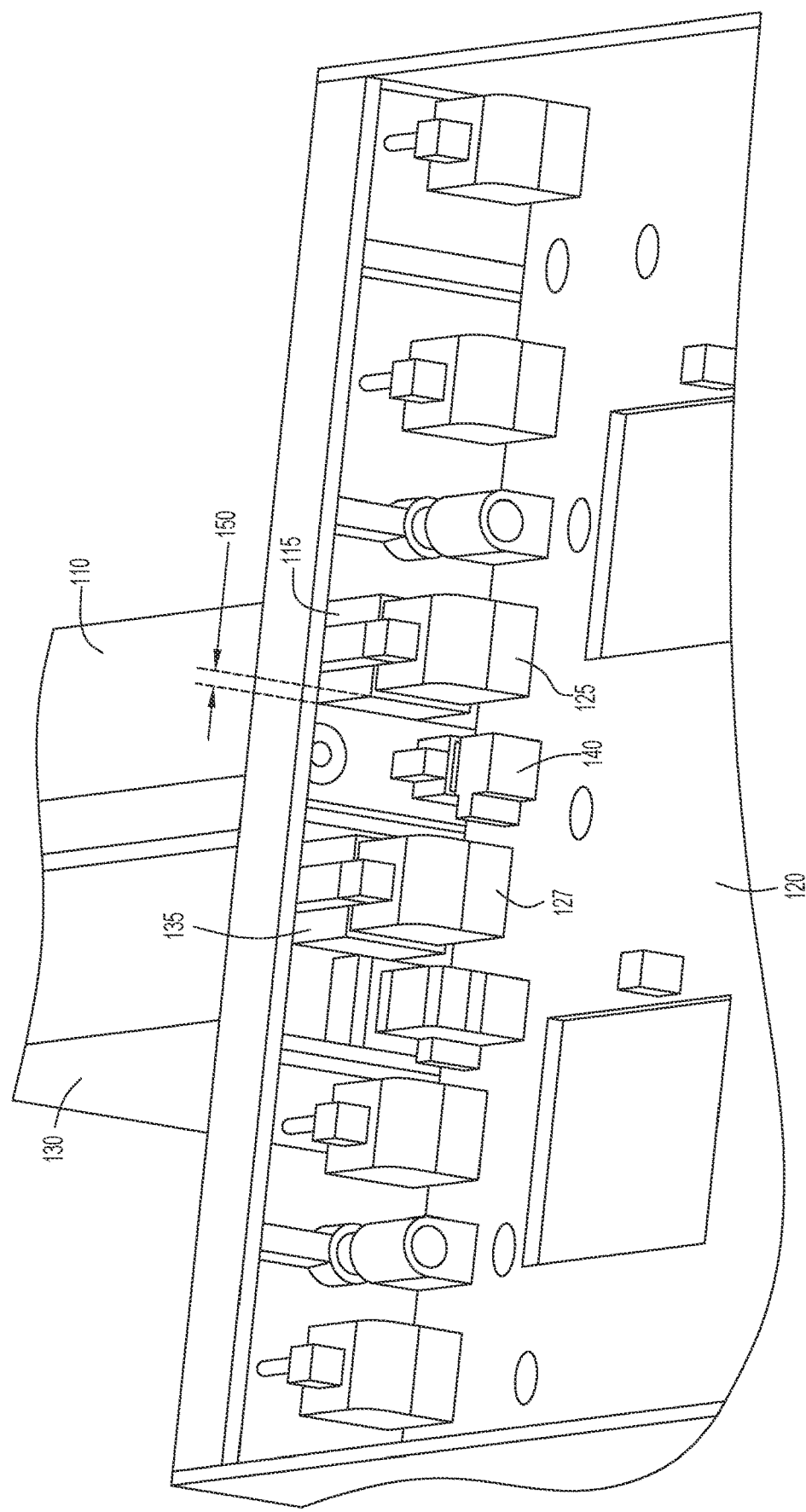
FIG. 1B illustrates a close-up view of the connection between two adjacent blade processors to a fabric card though ortho-direct electrical connectors, according to an example embodiment.

Referring now to FIG. 1B, a close up view of a connection between the fabric node 120 and adjacent computing nodes 110 and 130. The fabric node 120 connects to the computing node 110 through the connector 125 and the connector 115. That fabric node 120 also includes a second composite connector 127 adjacent to the composite connector 125. A second computing node 130 connects to the fabric node 120 through a composite connector 135 that mates with the second composite connector 127 on the fabric node 120. The composite connector 125 separated from the midplane 140 by a small distance 150. In one example, the distance 150 may be as small as 0.131 inches to accommodate as many individual connections as possible in the composite connector 125.

In another example, each computing node (e.g., computing node 110 and computing node 130) may include two connectors to the fabric node 120. The small distance 150 limits typical OD connectors to 48 differential pairs of electrical data in the allowed space for an OD connector. If a computing node (e.g., computing node 110) includes two OD connectors to connect to a fabric node (e.g., fabric node 120), then the I/O bandwidth is limited to 96 differential pairs through typical OD connectors, which is sufficient to carry two PCIe links with side bad control signals. However, for disaggregated computing systems involving GPUs and memories, at least four PCIe links may be required between the computing nodes. Additionally, the number of PCIe links is expected to grow in proportion to the number of cores in the computing node.

In order to transport four or more PCIe links, the composite connectors described herein (e.g., composite connectors 115, 125, 127, and 135) with modular sets of data connectors that enable electrical differential pairs of data connectors to be replaced with optical data connectors as needed to accommodate the additional bandwidth. The composite connectors described herein may include electrical differential pairs for data, Mechanical Transfer (MT) ferrules for optical data connections, electrical power conductors, and fluid conductors for transporting cooling fluid between the computing nodes and the fabric nodes.

Figure 2A:
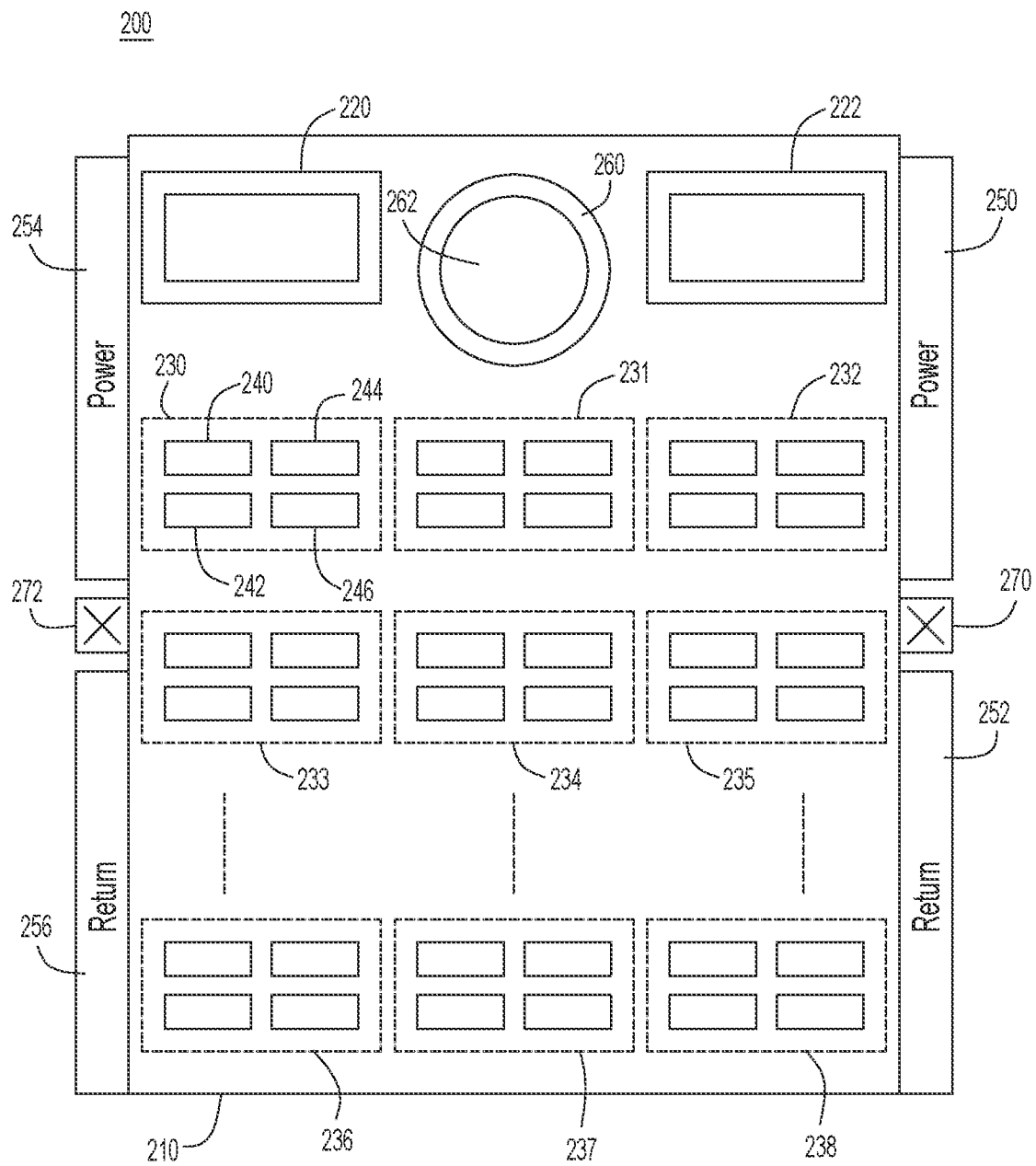
FIGS. 2A-2D illustrate configurations of a composite connector, according to an example embodiment.

Referring now to FIG. 2A, a front view of a first configuration of a composite connector 200 is shown. The composite connector 200 may be implemented as one of the composite connectors 115, 125, 127, or 135 shown in FIG. 1A and FIG. 1B. The composite conductor 200 includes a housing 210 that constrains all of the individual connections into a compact space for blind mating with a complementary connector. In one example, the housing 210 may constrain all of the individual connections within a confined physical space less than 25 millimeters by 30 millimeters or approximately 750 square millimeters. However, other examples of the housing 210 may be bigger or smaller to accommodate different requirements (e.g., I/O or cooling fluid) of the connected nodes (e.g., computing node 110 and fabric node 120).

The composite connector 200 also includes optical data connector modules 220 and 222. Electrical data connectors are grouped into a matrix of modular groups 230-238 that are approximately the same size as the optical data connectors modules 220 and 222 to allow for a group of electrical data connectors to be replaced with an optical data connector. The modular group 230 includes individual electrical conductors 240, 242, 244, and 246, and each modular group 231, 232, 233, 234, 235, 236, 237 and 238 includes similar individual electrical connectors. In one example, the optical data connector modules 220 and 222 are MT ferrules that are positioned away from the matrix of modular groups 230-238. In another example, the composite connector 200 may include more than the nine modular groups 230-238 as labeled and shown in FIG. 2A. For instance, the composite connector 200 may include twenty-four modular groups of two differential pairs of electrical conductors for a total of forty-eight differential pairs of electrical conductors.

The composite connector 200 also includes electrical power connectors 250, 252, 254, and 256 disposed on the side of the housing 210. In one example, the electrical power connectors 250 and 254 may be configured to supply power, while the electrical power connectors 252 and 256 are configured as the return path for the electrical power. Alternatively, any of the electrical power connectors 250, 252, 254, or 256 may be configured as a power supply or a power return path.

The composite connector 200 includes an alignment feature 260 (e.g., an alignment pin) that is configured to align the composite connector 200 with a complementary composite connector. The interior of the alignment feature 260 serves as a fluid exchange connector 262 to transfer cooling fluid to a complementary composite connector. The cooling fluid may be provided through the fluid exchange connector 262 to cool CPUs or other high power components on computing nodes. In one example, the fluid exchange connector may include a valve structure to prevent cooling fluid from leaking while the composite connector 200 is not connected or during the connection process with a complementary composite connector. In the example shown in FIG. 2A, the alignment feature 260 is surrounded by the optical data connector modules 220 and 222 to avoid any impact on the number of electrical conductors in the matrix of modular groups 230-238.

The composite connector 200 also includes keying features 270 and 272 that are configured to prevent the composite connector 200 from mating with a similarly sized composite connector which is not configured with the same individual connectors as the composite connector 200. For instance, the keying features 270 and 272 may correspond to the configuration of optical data connector modules 220 and 222 and the modular groups 230-238 of the electrical data connectors. Since there are multiple combinations of optical data connector modules and electrical data connector modules, the keying features 270 and 272 prevent the composite connector 200 from mating with mismatched composite connectors.

Figure 2B:
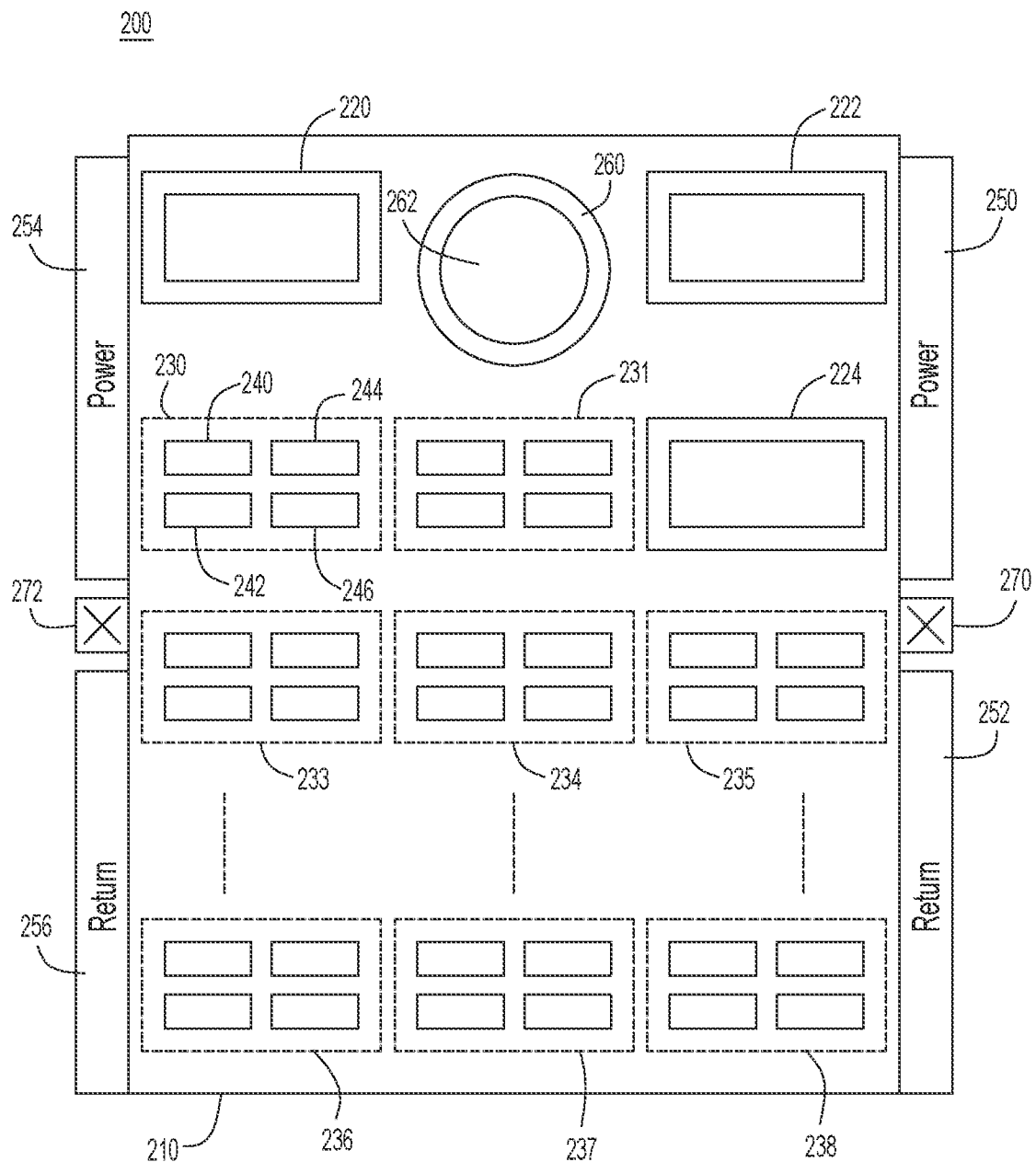

Referring now to FIG. 2B, a second configuration of the composite connector 200 is shown. In this configuration, the modular group 232 of electrical data connectors shown in FIG. 2A is replaced by an optical data connector module 224. In one example, the optical data connector modules 220, 222, and 224 are MT ferrules such that they mate in a coplanar fashion with corresponding MT ferrules on a complementary composite connector. The optical data connector modules 220, 222, and 224 may comprise a ribbonized optical fiber bundle that may be inserted into the housing 210 or removed from the housing 210 independently. The optical fiber bundle may be independently removed from the computing node or the fabric node side to maximize the serviceability and to enable field upgradability.

Each of the MT ferrules in the optical data connector modules 220, 222, or 224 may carry multiple fibers (e.g., thirty-two individual fibers). The fibers may be single mode fibers or multimode fibers, depending on the optical transceiver being used in the computing node and the fabric node. In one example, the optical data connector modules 220, 222, and 224 may be Multi-Fiber Push-On (MPO) or Multi-Fiber Termination Push-On (MTP) modules. The MPO/MTP modules may include beam expanders and/or collimating lenses, for instance to overcome signal loss due to fine dust particles.

Figure 2C:
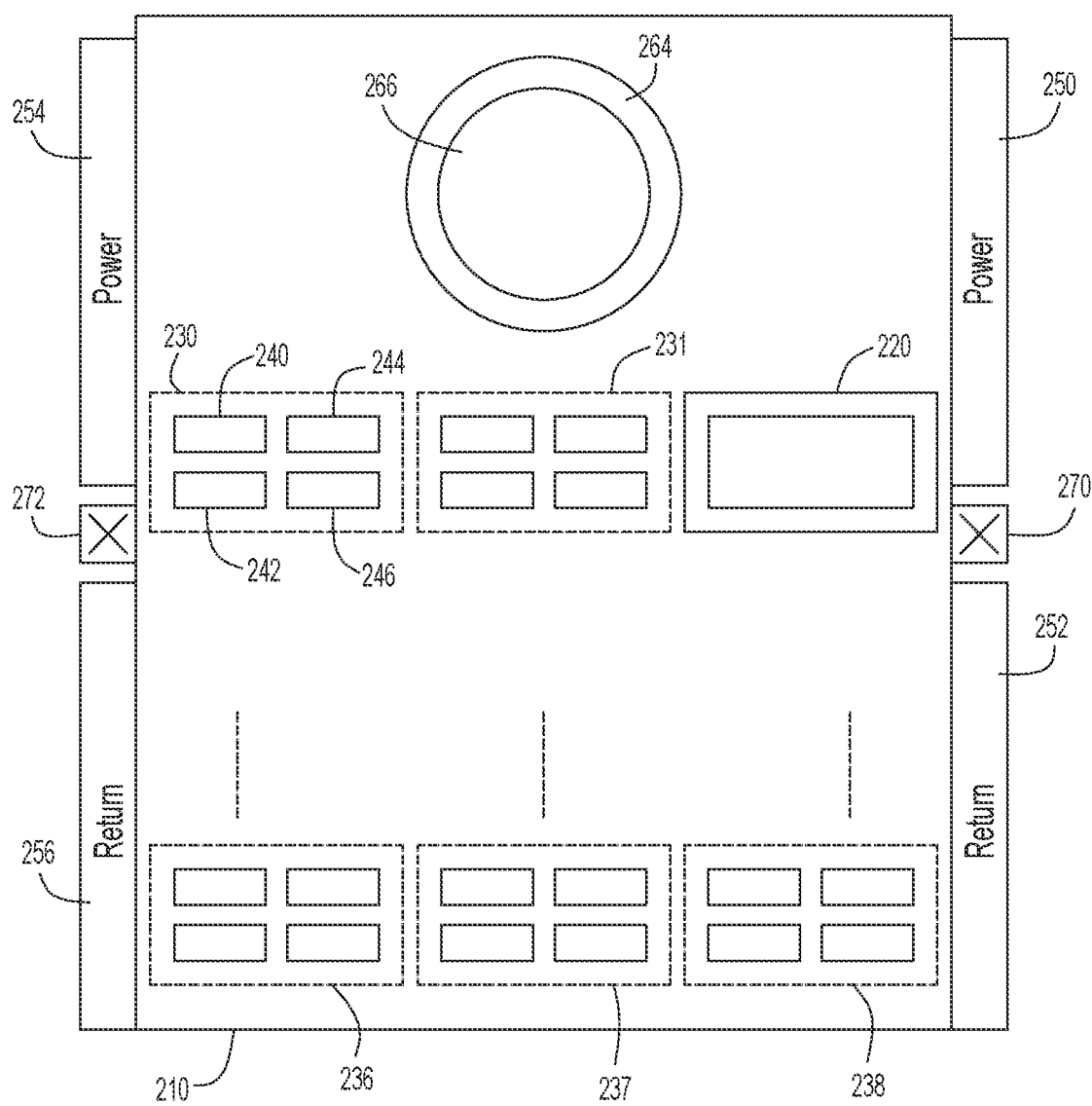
Figure 2D:
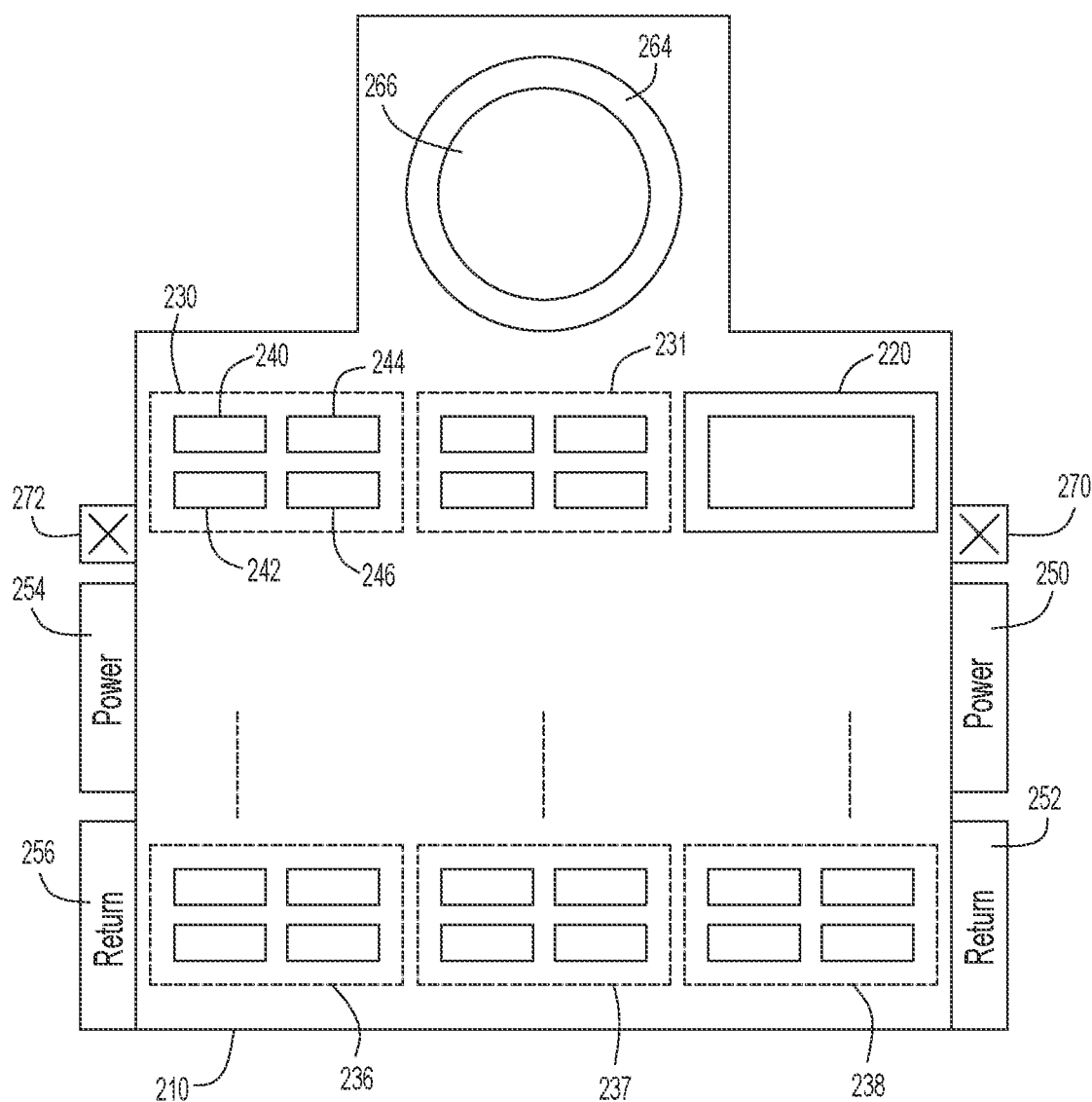

Referring now to FIG. 2C, a third configuration of the composite connector 200 is shown. In some cases, a larger alignment feature 264 may enable more cooling fluid to pass through a larger fluid exchange connector 266 and accommodate a larger thermal load of computing nodes. An alternate configuration for a connector 200 with a larger alignment feature 264 and fluid exchange connector 266 is shown in FIG. 2D.

Figure 3A:
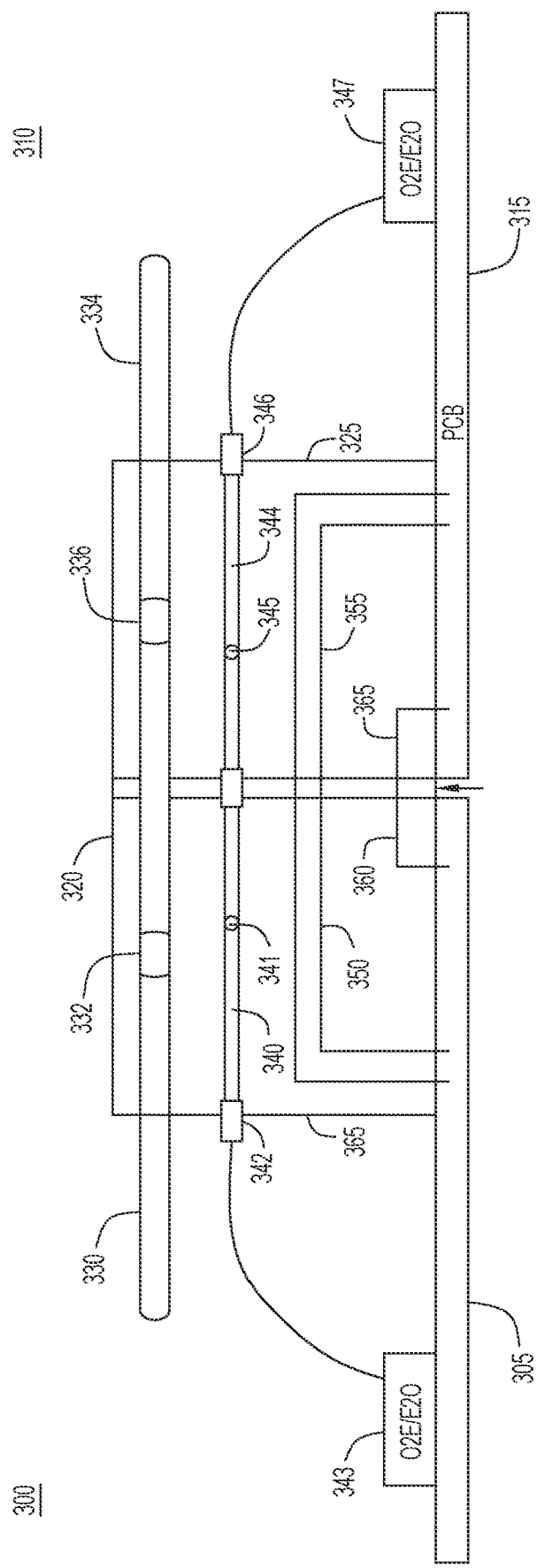
FIG. 3A illustrates a connection between nodes of a disaggregated computing system in a parallel orientation, according to an example embodiment.

Referring now to FIG. 3A, a side view is shown of a mated connection between a node 300 (e.g., computing node 110) and a node 310 (e.g., fabric node 120) in which the PCBs connected to the respective composite connectors are parallel. The node 300 includes a PCB 305 to provide structure and electrical connections to the electronic components (e.g., CPU, cache memory, power supply, etc.) of the node 300. Similarly, the node 310 includes a PCB 315 to provide structure and electrical connections to the electronic components of the node 310. A composite connector housing 320 is attached to the PCB 305 to contain the individual connectors in a constrained physical space. Similarly, a composite connector housing 325 is attached to the PCB 315 of the node 310.

The composite connector housing 320 includes a fluid exchange connector 330 to carry cooling fluid to or from components in the node 300. The fluid exchange connector 330 includes a valve structure 332 to prevent the passage of cooling fluid unless the fluid exchange connector 330 is properly mated with a complementary fluid exchange connector 334 in the composite connector housing 325 of the node 310. The complementary fluid exchange connector 334 also includes a valve structure 336 to prevent leakage of cooling fluid. In one example, the fluid exchange connector 330 includes one or more pipes that direct the cooling fluid to thermal loads in the node 300, such as CPUs and/or GPUs. The fluid exchange connector 334 may include one or more pipes that direct the cooling fluid to a radiator/heat sink on the node 310 or to an external pump/radiator that is connected to the node 310. The fluid exchange connectors 330 and 334 may be integrated into alignment features that ensure that the housing 320 aligns with the housing 325 and all of the individual connectors in the housing 320 align with complementary individual connectors in the housing 325.

The housing 320 also includes at least one optical connector 340 (e.g., a waveguide) for transmitting and receiving optical data, such as I/O data for a processing unit in the node 300. The optical connector 340 includes a lens 341 for beam shaping (e.g., expansion or collimation) of optical signals in the optical connector 340. The optical connector 340 ends with an MT ferrule 342 that connects to an optical/electrical converter 343 that is attached to the PCB 305. The optical/electrical converter 343 converts optical data signals from the optical connector 340 into electrical data signals that may be transmitted through traces in the PCB 305 to electrical components (e.g., CPUs) in the node 300. The optical/electrical converter 343 also converts electrical data signals from the electrical components of the node 300 into optical data signals for transmission through the optical connector 340. In one example, the optical/electrical converter may include separate components, for instance, to convert from electrical signals to optical signals and to convert from optical signals to electrical signals.

Similarly, the housing 325 includes at least one optical connector 344 (e.g., a waveguide) for transmitting and receiving optical data, such as I/O data. The optical connector 344 includes a lens 345 for beam shaping and is connected through an MT ferrule 346 to an optical/electrical converter 347. In one example, the housing 325 includes the same number of optical connectors 344 as the number of optical connectors 340 that are included in the housing 320. In another example, at least some of the optical data passing through the optical connectors 340 and 344 may be processed optically before, or instead of, being converted by the optical/electrical converters 343 and 347.

The housing 320 also includes at least one electrical data connector 350 (e.g., a differential pair of conductors) for transmitting and receiving electrical data, such as I/O data. The electrical data connector 350 provide electrical data through the PCB 305 to electrical components (e.g., CPUs, GPUs, memory, etc.) in the node 300. The one or more electrical data connectors 350 match one or more electrical data connectors 355 in the housing 325 of the node 310. The electrical data connectors 355 connect to electrical components in the node 310 through traces in the PCB 315.

The housing 320 further includes one or more electrical power connectors 360 for providing power to the components of the node 300. Alternatively, the electrical power connectors 360 may provide power to the node 310 through electrical power connectors 365 in the housing 325. In one example, the electrical power connectors 360 and 365 may be bus bars disposed on the side of the housings 320 and 325, respectively.

Figure 3B:
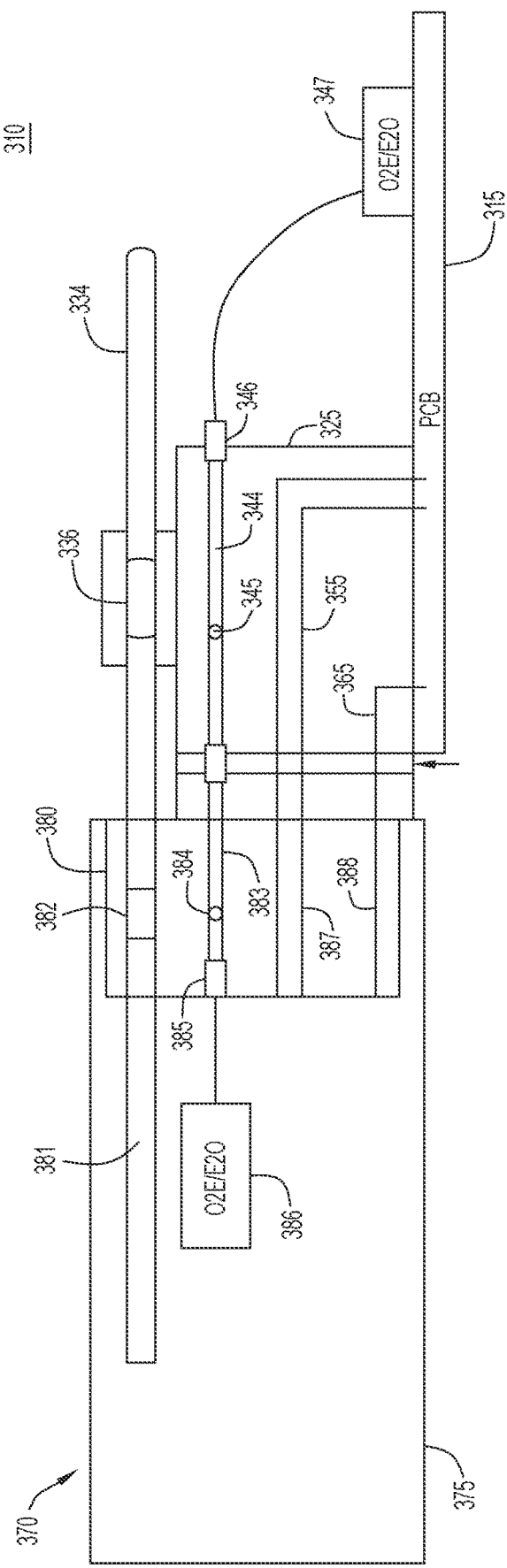
FIG. 3B illustrates a connection between nodes of a disaggregated computing system in an orthogonal orientation, according to an example embodiment.

Referring now to FIG. 3B, a side view is shown of a mated connection between a node 370 (e.g., computing node 110) and a node 310 (e.g., fabric node 120) in which the PCBs connected to the respective composite connectors are orthogonal. In the orthogonal configuration shown in FIG. 3B, the PCB 375 of the node 370 is orthogonal to the PCB 315 of the node 310. The composite connector of the node 370 includes a housing 380 connected to the PCB 375 and includes individual connectors similar to the individual connectors shown in FIG. 3A. The housing 380 includes a fluid exchange connector 381 with a valve structure 382, as well as one or more optical data connectors 383 with a lens 384, and an MT ferrule 385 connecting to an optical/electrical converter 386. The housing 380 also includes one or more electrical data connectors 387 and one or more electrical power connectors 388.

In one example, the orientation of the PCBs 305, 315, and 375 matches the orientation of the entire nodes 300, 310, and 370, respectively. Alternatively, the orientation of the PCBs 305, 315, and/or 375 may not match the orientation of the entire nodes 300, 310, and/or 370, respectively, to allow for flexibility in connecting nodes. In other words, the parallel configuration of the PCBs 305 and 315 as shown in FIG. 3A may be implemented in nodes that are connected orthogonally, such as computing node 110 and fabric node 120 as shown in FIG. 1A.

Figure 4A:
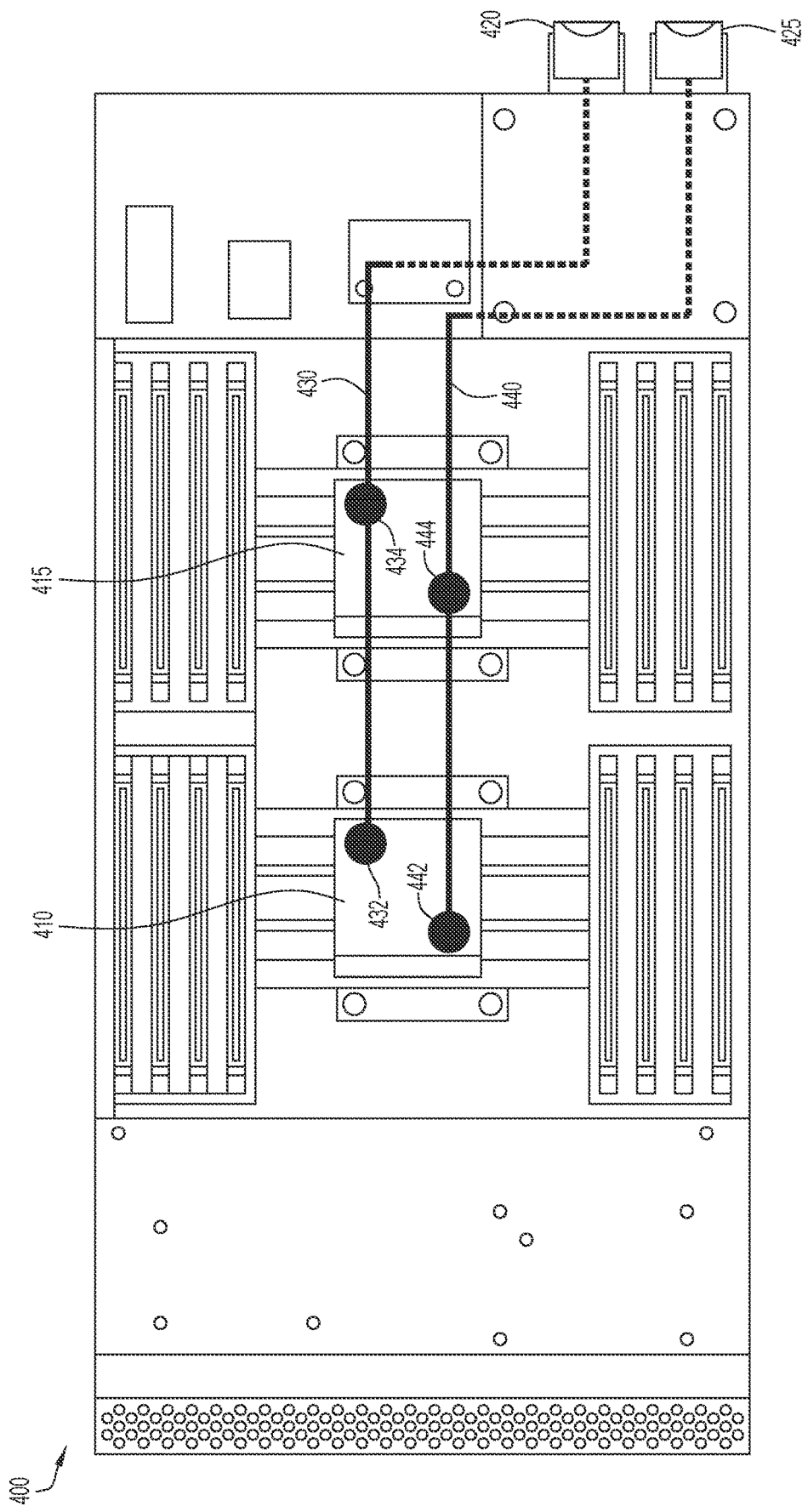
FIG. 4A illustrates thermal management conduits in a computing blade, according to an example embodiment.

Referring now to FIG. 4A, a diagram of a computing node 400 illustrates one example of a cooling system that uses the fluid exchange connectors of composite connectors. The computing node 400 includes a processing unit 410 and a processing unit 415 as thermal loads. In one example, the processing units 410 and 415 may be CPUs of a dual processor computing blade. The computing node 400 includes a composite connector 420 for supplying cool fluid and a composite connector 425 for removing hot fluid.

The composite connector 420 provides low temperature fluid to a pipe 430 that is routed to the processing units 410 and 415. The cool fluid from the pipe 430 is provided to the processing units 410 and 415 at fluid entry sites 432 and 434, respectively. After absorbing heat from the processing units 410 and 415, high temperature fluid enters a pipe 440 that directs the high temperature fluid to the connector 425. The high temperature fluid from processing units 410 and 415 enters the pipe 440 at fluid exit sites 442 and 444, respectively.

In the example depicted in FIG. 4A, the two thermal loads of the processing units 410 and 415 are cooled in parallel. However, in other examples, additional thermal loads may be provided with cooling fluid. Additionally, the cooling fluid may be provided to thermal loads in series, i.e., the higher temperature fluid of one thermal load may be provided as low temperature fluid to another thermal load. For instance, a cooling fluid pipe may be routed to a relatively small thermal load (i.e., a component that produces relatively small amounts of heat, such as a memory) before a relatively larger thermal load, such as a processor, if the small thermal load does not add significant amounts of heat to the cooling fluid before the cooling fluid reaches the relatively higher thermal load. In further example, the cooling fluid may be provided through a combination of parallel and serial fluid pipes. The placement of components within the computing node may present a design tradeoff for reducing the thermal efficiency of providing cooling fluid in parallel to all of the thermal loads separately.

Figure 4B:
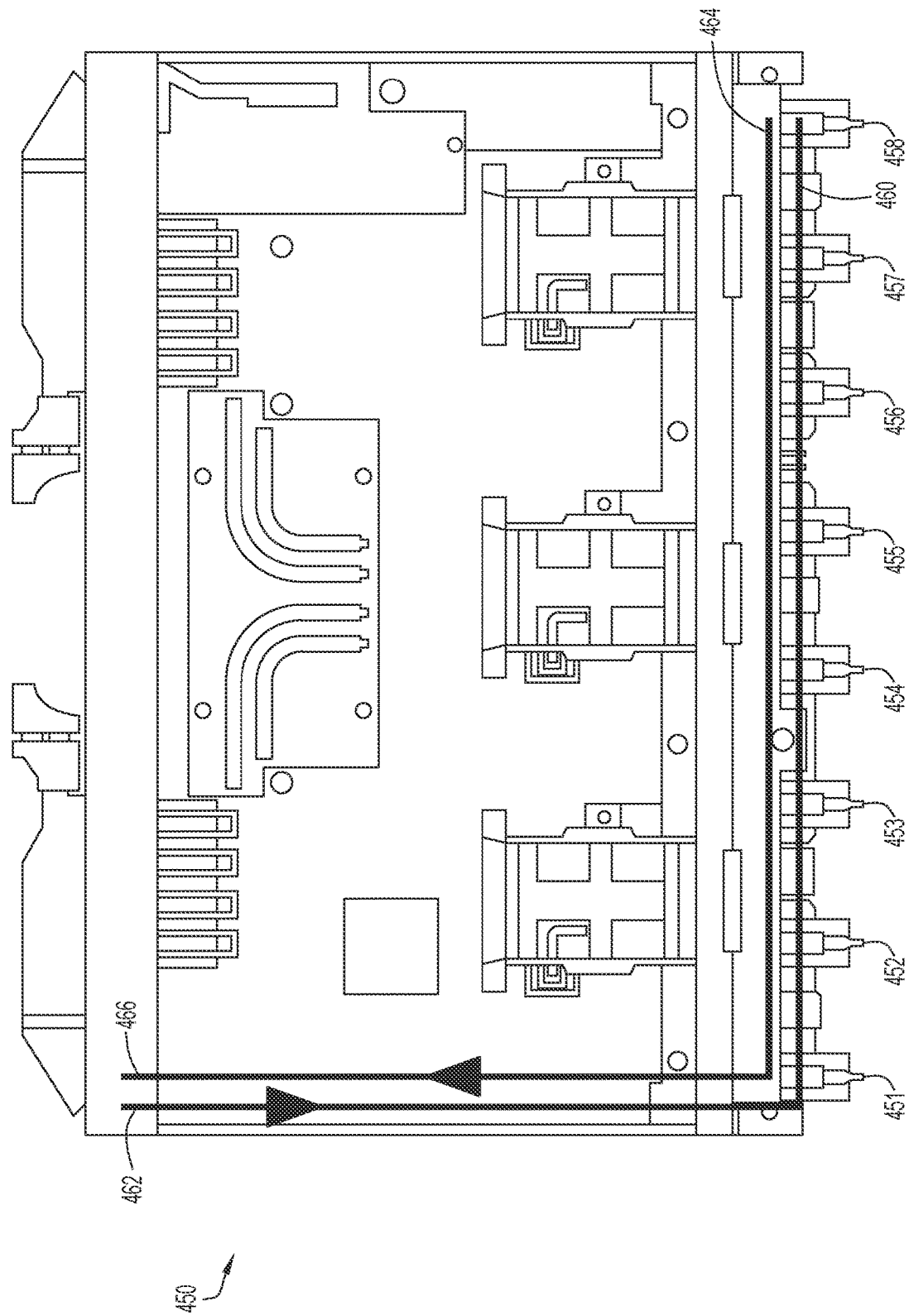
FIG. 4B illustrates thermal management conduits in a fabric card, according to an example embodiment.

Referring now to FIG. 4B, a diagram of a fabric node 450 illustrates one example of a cooling system that uses the fluid exchange connectors of composite connectors. The fabric node 450 includes composite connectors 451-458, with each of the composite connectors 451-458 including fluid exchange connectors. Low temperature cooling fluid is distributed to at least some of the connectors 451-458 through a pipe 460. The low temperature cooling fluid is obtained at the fabric node 450 through a port 462 that connects to an external pump and radiator/chiller. High temperature fluid is collected from at least some of the connectors 451-458 through a pipe 464 and provided to the external pump and radiator/chiller through a port 466.

In one example, each of the composite connectors 451-458 either is connected to the pipe 460 and provides low temperature fluid or is connected to the pipe 464 and collects high temperature fluid. For instance, the composite connector 451, 453, 455, and 457 may be connected to the pipe 460 and the composite connectors 452, 454, 456, and 458 may be connected to the pipe 464. Alternatively, all of the composite connectors 451-458 may be connected to one or both of the pipes 460 and 464.

Figure 4C:
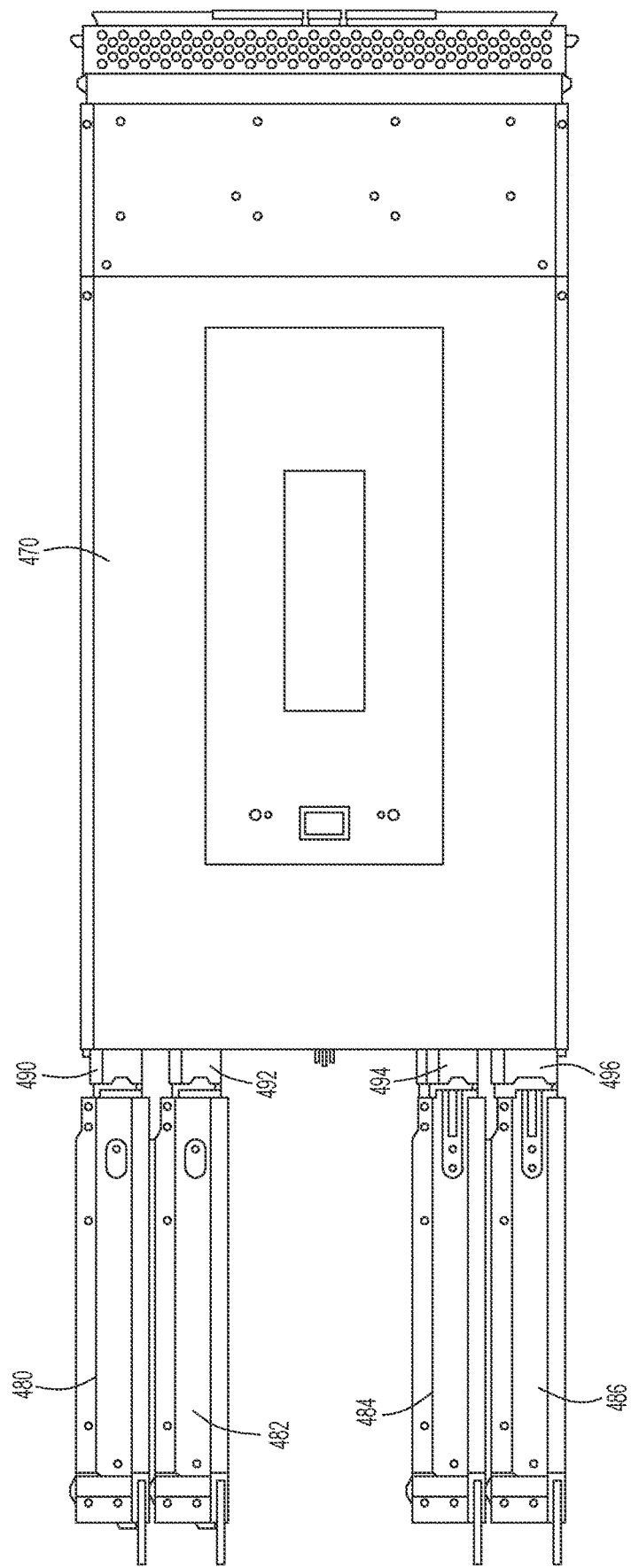
FIG. 4C illustrates thermal management for a computing blade connected to multiple fabric cards, according to an example embodiment.

Referring now to FIG. 4C, an example of a cooling circuit for a computing node 470 is shown. The computing node 470 connects to fabric nodes 480, 482, 484, and 486 through composite connectors 490, 492, 494, and 496, respectively. Each of the fabric nodes 480, 482, 484, and 486 may be part of a cooling circuit for the computing node 470. In one example, each fabric node 480, 482, 484, and 486 provides an independent cooling circuit, i.e., each fabric nodes both provides low temperature fluid and collects high temperature fluid from the computing node 470. In another example, a cooling circuit may include fabric node 480 providing low temperature fluid in one direction through the composite connector 490, and fabric node 482 collecting high temperature fluid in the opposite direction through composite connector 492.

In other examples, additional combinations of cooling circuits may enable fabric nodes 480 and 482 to form a single cooling circuit while fabric nodes 484 and 486 form additional independent cooling circuits. Each cooling circuit may be directed to the same or different components in the computing node 470. For instance, a computing node 470 that is a dual processor blade unit may have a first CPU cooled by a cooling circuit through fabric nodes 480 and 482, while a second CPU is cooled by a cooling circuit through fabric nodes 484 and 486.

Figure 5:
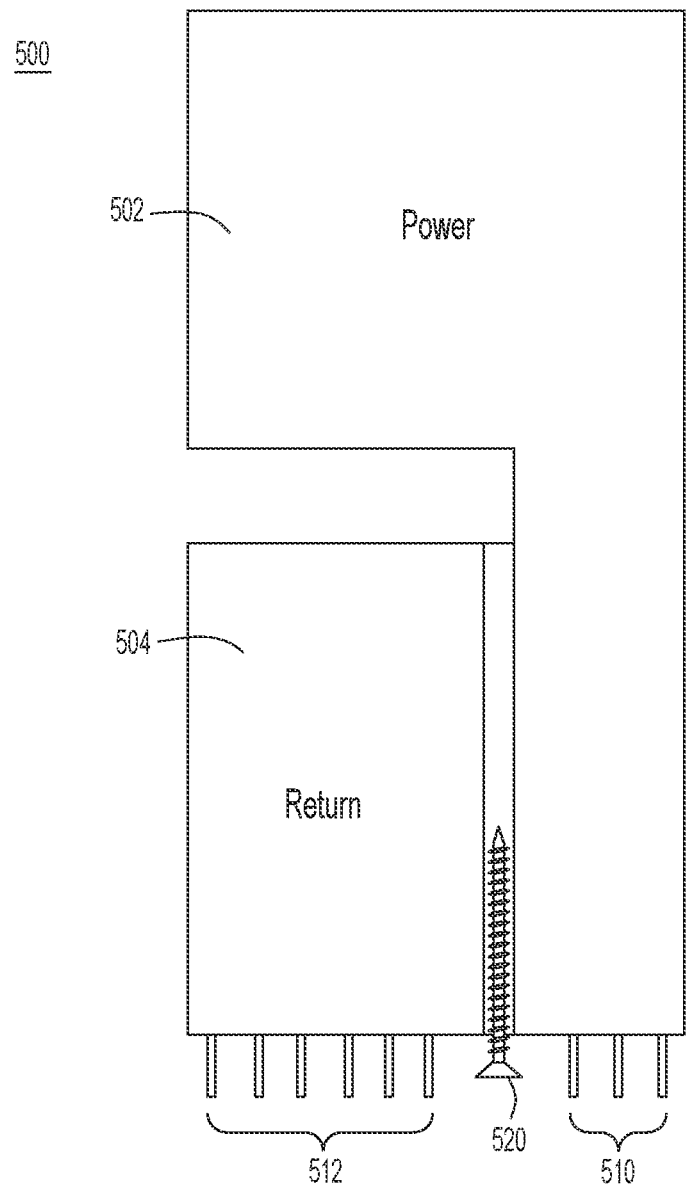
FIG. 5 illustrates electrical power contacts for a composite connector, according to an example embodiment.

Referring now to FIG. 5, an example of a pair of electrical power connectors 500 (e.g., electrical power connectors 250 and 252 shown in FIGS. 2A-2D) for a composite connector (e.g., composite connector 200 shown in FIGS. 2A-2D) is shown. Electrical power is provided through the pair of electrical power connectors 500 by holding an electric potential across a power bus 502 and a return bus 504. The power bus 502 is connected to traces in a PCB (not shown) through pins 510. Similarly, the return bus 504 is connected to traces in the PCB through pins 512. A fastening screw 520 secures the pair of electrical power connectors 500 to the PCB, and may secure the entire housing of the composite connector to the PCB.

In one example, the power bus 502 and the return bus 504 are copper bars that mate with complementary copper bars on a complementary composite connector. For co-planar composite connections (e.g., as shown in FIG. 3A), the pair of electrical power connectors 500 may be disposed on one or both sides of the composite connector. For ortho-direct composite connections in which the PCBs of the composite connectors are oriented orthogonally (e.g., as shown in FIG. 3B), the pair of electrical power connectors 500 may be placed on the side of the connector that can contact the PCB. Additional cables or wire frames with a 90° bend may connect the pair of electrical power connectors 500 to the PCB if the electrical power connector is oriented at a 90° or 270° angle to the PCB.

Figure 6:
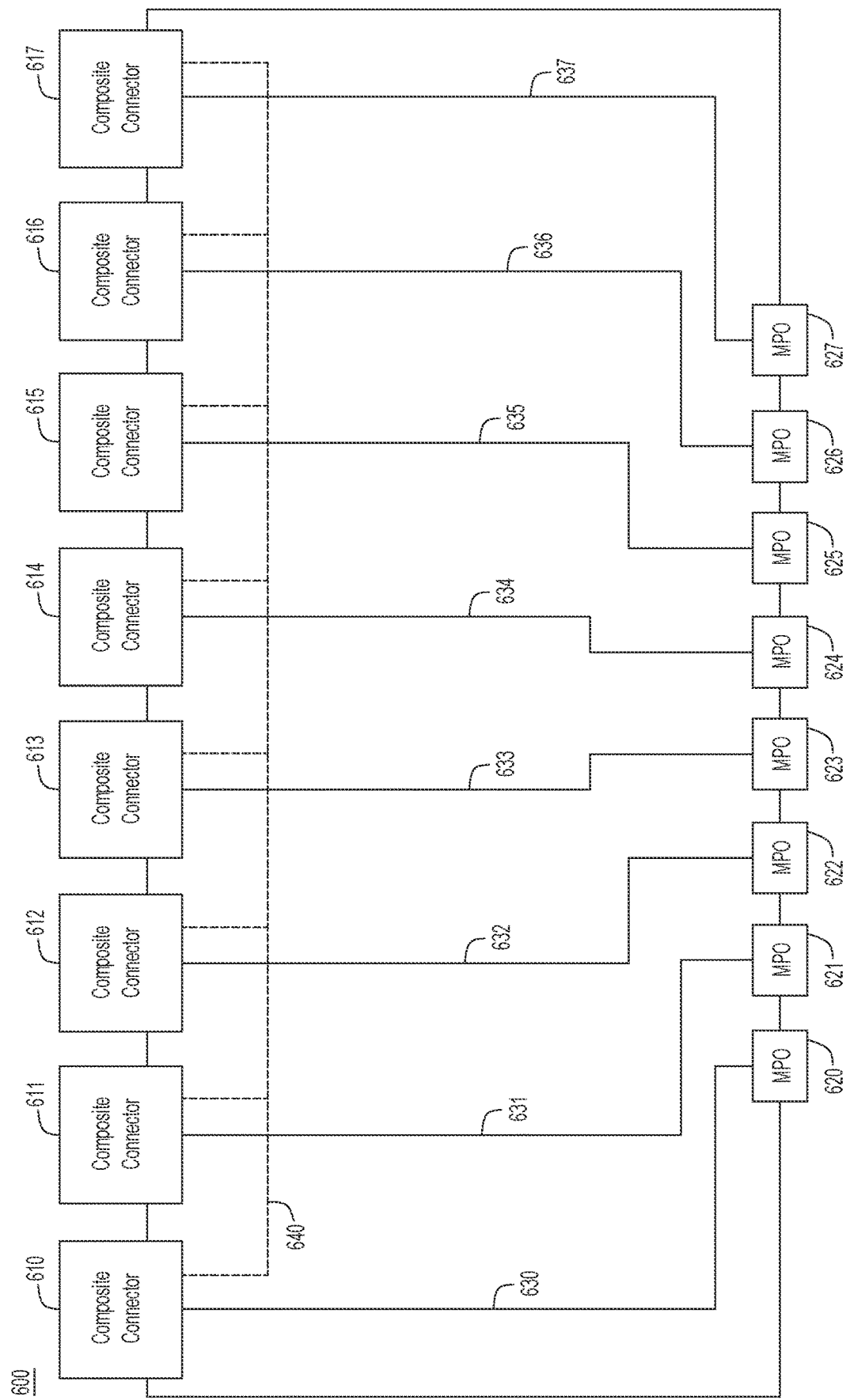
FIG. 6 is a simplified block diagram of a fabric card configured to connect a plurality of computing blades, according to an example embodiment.

Referring now to FIG. 6, a simplified block diagram illustrates internal optical data connections of a fabric node 600. The fabric node 600 includes composite connectors 610, 611, 612, 613, 614, 615, 616 and 617 (collectively referenced as composite connectors 610-717) that are configured to connect to computing nodes (not shown). The fabric node 600 also includes external optical connectors 620, 621, 622, 623, 624, 625, 626 and 627 (e.g., MPO/MPT connectors and collectively referenced as optical connectors 620-627) to provide external connectivity for optical data of the computing nodes attached to each of the composite connectors 610-617. Fiber bundles 630, 631, 632, 633, 634, 635, 636 and 637 (collectively referred to as fiber bundles 630-637) connect composite connectors 610-617 to external optical connectors 620-627, respectively.

Additionally, optical links 640 may connect the composite connectors 610-617 to enable high bandwidth connectivity between computing nodes. For instance, the optical links 640 enable inter CPU cache coherent links to implement multi-socket servers. In one example, the optical links 640 may comprise a mesh of individual optical fiber links between each composite connector 610-617. For instance, composite connector 610 may be connected to composite connector 611 through a first optical fiber link, connected to composite connector 612 through a second optical fiber link, connected to composite connector 613 through a third optical fiber link, and so on. For simplicity, individual fiber links in the optical links 640 are not shown in FIG. 6. Further, electrical data connections from the composite connectors 610-617 may be connected to a PCIe or other fabric switch on the fabric node 600 for communication between computing nodes, but are not explicitly shown in FIG. 6 for clarity.

Figure 7:
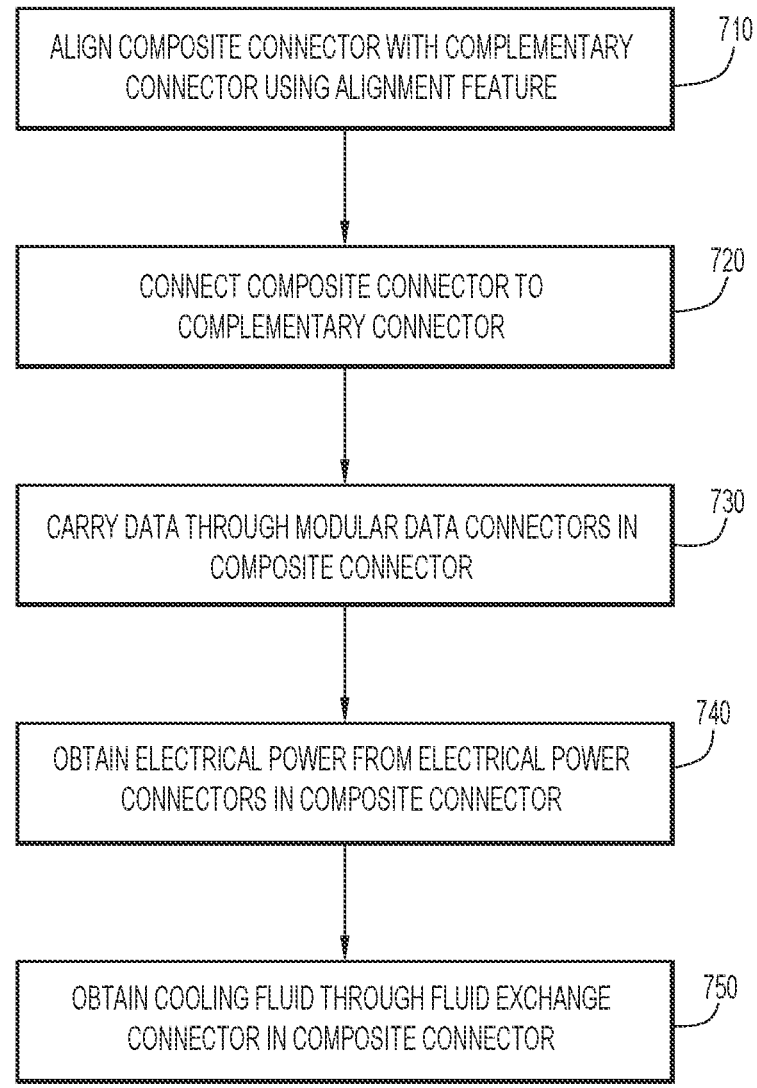
FIG. 7 is a flowchart illustrating operations performed to connect nodes of a disaggregated computing system through a composite connector, according to an example embodiment.

Referring now to FIG. 7, a flowchart illustrates operations performed in a process 700 to connect a composite connector (e.g., composite connector 115 shown in FIGS. 1A and 1B) with a complementary connector (e.g., composite connector 125 shown in FIG. 1A and FIG. 1B) and combine multiple connections through a confined physical space. At 710, an alignment feature is used to align the composite connector with the complementary connector. In one example, the alignment feature comprises one or more hollow pins or receptacles. When properly aligned, the composite connecter and the complementary connector are connected at 720. In one example, connecting the composite connector to the complementary connector connects multiple individual connections including electrical data connections, optical data connections, fluid exchange connections, and electrical power connections.

At 730, the composite connector caries data through a plurality of modular data connectors, including electrical data connectors and optical data connectors. In one example, the electrical data connectors comprise differential pairs grouped into modules that are interchangeable with optical data connectors. In another example, the optical data connectors are multi-fiber bundles and include one or more optical elements (e.g., lenses) to shape the optical signal through the optical data connectors.

At 740, the composite connector obtains electrical power from at least one pair of electrical power connectors. In one example, the electrical power connectors comprise bus bars disposed on the side of a housing of the composite connecter. At 750, the composite connector obtains cooling fluid through a fluid exchange connector. In one example the fluid exchange connector includes a valve structure to prevent cooling fluid from flowing unless the composite connector is securely coupled to the complementary connector.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In summary, the modularity of the composite connector described herein enables devices to be shipped with electrical connectivity and upgraded to optical connectivity as needed at a customer site. Heterogeneous computing and composable architectures require I/O to scale to maintain the pace of advances in the capabilities of individual device nodes (e.g., compute cores, accelerators, etc.). Currently, almost all I/O from CPUs in composable architecture system is electrical data, which presents challenges in accessing the I/O from outside the CPU node due to the bandwidth and distance constraints on electrical data connections. Optical I/O may alleviate the electrical data connection constraints, but typically requires earlier planning for scaling to optical data connections. With the composite connector disclosed herein, a device may begin with a default mix of electrical and optical I/O, but as the capability of other components increases, electrical I/O connections may be upgraded to optical I/O connections.

Thermal issues scale with as the computing power of the components in a disaggregated computing system, and at some point switching from air cooling to liquid cooling may be required to maintain an acceptable temperature environment. Liquid cooling requires circulation of cold and hot liquid throughout the system by using a plumbing interconnect between nodes of the system. The composite connector described herein enables nodes to scale data connectivity into optical I/O connections and to scale a fluid cooling system as an integrated solution. The composite connector described herein integrates modular electrical/optical data connections, fluid cooling connections, and electrical power connections into a confined physical space.

In one form, an apparatus comprising modular data connectors, electrical power connectors, a fluid exchange connector, an alignment feature, and a housing is provided. The plurality of modular data connectors are configured to carry data and include electrical data connectors and optical data connectors. The apparatus includes at least one pair of electrical power connectors configured to carry electrical power, and a fluid exchange connector configured to carry cooling fluid. The apparatus also includes an alignment feature to align the apparatus with a complementary connector. The housing of the apparatus is configured to contain the plurality of modular data connectors, the electrical power connectors, the fluid exchange connector, and the alignment feature in a confined physical space.

In one example, one or more of the electrical data connectors are configured to be replaced with one or more additional optical data connectors. In another example, the apparatus is configured to blind mate with the complementary connector in a rack. The complementary connector includes a plurality of complementary data connectors, at least one pair of complementary electrical power connectors, a complementary fluid exchange connector, and a complementary alignment feature. In a further example, the apparatus includes a keying feature configured to prevent mismatched data connectors. The keying feature corresponds to a particular configuration of the plurality of modular data contacts. In yet another example, the fluid exchange connector is combined with the alignment feature. In still another example, the electrical power connectors comprise bus bars disposed on at least one side of the housing.

In another form, a system comprising a computing device and a connector is provided. The connector is coupled to the computing device and includes a plurality of modular data connectors configured to carry data. The plurality of modular data connectors include electrical data connectors and optical data connectors. The connector also includes a fluid exchange connector configured to carry cooling fluid and an alignment feature configured to align the connector with a complementary connector. The connector further includes a housing configured to contain the plurality of modular data connectors, the at least one pair of electrical power connectors, the fluid exchange connector, and the alignment feature in a confined physical space.

In one example, the computing device comprises a compute core, an I/O fabric node, a data storage node, a memory node, or an accelerator node. In another example, the connector is a first connector and the system includes a second connector through which fluid flows in an opposite direction than the fluid flows through the first connector.

In a further form, a method for using a composite connector is provided. The method includes aligning the composite connector with a complementary connector using an alignment feature and connecting the composite connector to the complementary connector. The method also includes carrying data through a plurality of modular data connectors in the composite connector, which includes electrical data connectors and optical data connectors. The method further includes obtaining electrical power from at least one pair of electrical power connectors in the composite connector and obtaining cooling fluid through a fluid exchange connector in the composite connector. A housing of the composite connector contains the plurality of modular data connectors, the at least one pair of electrical power connectors, the fluid exchange connector, and the alignment feature in a confined physical space.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims. For instance, the specific IEs described are used as examples of IEs that are currently defined in 3GPP specifications, but the techniques described herein may be adapted to other IEs that may be defined in current or future network specifications.

Each embodiment disclosed herein has been included to present one or more different features. However, all disclosed embodiments are designed to work together as part of a single larger system or method. This disclosure explicitly envisions compound embodiments that combine multiple previously-discussed features in different embodiments into a single system or method.

What is claimed is:

1. An apparatus comprising:
   a plurality of modular data connectors configured to carry data, the plurality of modular data connectors including electrical data connectors and optical data connectors;
   at least one pair of electrical power connectors configured to carry electrical power;
   a fluid exchange connector configured to carry cooling fluid;
   an alignment feature configured to align the plurality of modular data connectors with a plurality of complementary data connectors in a rack to enable blind mating of the electrical data connectors and the optical data connectors of the plurality of modular data connectors with the plurality of complementary data connectors; and
   a housing configured to contain the plurality of modular data connectors, the at least one pair of electrical power connectors, the fluid exchange connector, and the alignment feature in a confined physical space.

2. The apparatus of claim 1, wherein one or more of the electrical data connectors are configured to be replaced with one or more additional optical data connectors.

3. The apparatus of claim 1, wherein the plurality of complementary data connectors in the rack are combined with at least one pair of complementary electrical power connectors, a complementary fluid exchange connector, and a complementary alignment feature.

4. The apparatus of claim 1, further comprising a keying feature configured to prevent mismatched data connectors, the keying feature corresponding to a particular configuration of the plurality of modular data connectors.

5. The apparatus of claim 1, wherein the fluid exchange connector is coupled to an interior surface of the alignment feature.

6. The apparatus of claim 1, wherein the at least one pair of electrical power connectors comprise bus bars disposed on at least one side of the housing.

7. A system comprising:
   a computing device;
   a first connector coupled to the computing device, the first connector comprising:

a plurality of modular data connectors configured to carry data, the plurality of modular data connectors including electrical data connectors and optical data connectors;

at least one pair of electrical power connectors configured to carry electrical power for the computing device;

a fluid exchange connector configured to carry cooling fluid;

an alignment feature configured to align the first connector with a complementary connector; and a housing configured to contain the plurality of modular data connectors, the at least one pair of electrical power connectors, the fluid exchange connector, and the alignment feature in a confined physical space; and a second connector configured to be coupled to the computing device, wherein the cooling fluid flows through the first connector in an opposite direction than cooling fluid that flows through the second connector.

8. The system of claim 7, wherein one or more of the electrical data connectors are configured to be replaced with one or more additional optical data connectors.

9. The system of claim 7, wherein the first connector is configured to blind mate with a first complementary connector in a rack, wherein the first complementary connector includes a plurality of complementary data connectors, at least one pair of complementary electrical power connectors, a complementary fluid exchange connector, and a complementary alignment feature.

10. The system of claim 7, wherein each of the first connector and the second connector further comprises a keying feature configured to prevent mismatched data connectors, the keying feature corresponding to a particular configuration of the plurality of modular data connectors.

11. The system of claim 7, wherein the fluid exchange connector is coupled to an interior surface of the alignment feature.

12. The system of claim 7, wherein the at least one pair of electrical power connectors comprise bus bars disposed on at least one side of the housing.

13. The system of claim 7, wherein the computing device comprises a compute core, an Input/Output (I/O) fabric card, a data storage node, a memory node, or an accelerator node.

14. The system of claim 7, wherein the second connector is configured to blind mate with a second complementary connector in a rack.

15. A method comprising:

aligning a composite connector with a complementary connector using an alignment feature of the composite connector;

enabling blind mating of a plurality of modular data connectors of the composite connector to a plurality of complementary data connectors of the complementary connector using the alignment feature of the composite connector, the plurality of modular data connectors including electrical data connectors and optical data connectors;

carrying data through the plurality of modular data connectors in the composite connector;

obtaining electrical power from at least one pair of electrical power connectors in the composite connector; and obtaining cooling fluid through a fluid exchange connector in the composite connector, wherein a housing contains the plurality of modular data connectors, the at least one pair of electrical power connectors, the fluid exchange connector, and the alignment feature in a confined physical space.

16. The method of claim 15, further comprising replacing one or more of the electrical data connectors with one or more additional optical data connectors.

17. The method of claim 15, wherein the complementary connector includes integrating the plurality of complementary data connectors, to at least one pair of complementary electrical power connectors, a complementary fluid exchange connector, and a complementary alignment feature.

18. The method of claim 15, further comprising preventing mismatched data connectors with a keying feature on the composite connector, the keying feature corresponding to a particular configuration of the plurality of modular data connectors.

19. The method of claim 15, wherein obtaining cooling fluid comprises obtaining cooling fluid through the fluid exchange connector that is coupled to an interior surface of the alignment feature.

20. The method of claim 15, wherein obtaining electrical power comprises obtaining electrical power through bus bars disposed on at least one side of the housing.

* * * * *